United States Patent
Kuttner et al.

(10) Patent No.: US 7,135,999 B2
(45) Date of Patent: Nov. 14, 2006

(54) CIRCUIT ARRANGEMENT FOR COMPENSATION FOR NONLINEARITIES FROM ANALOG/DIGITAL CONVERTERS OPERATING WITH DIFFERENT TIMING

(75) Inventors: Franz Kuttner, St. Ulrich (AT); Christian Vogel, Graz (AT); Dieter Draxelmayr, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/067,589

(22) Filed: Feb. 26, 2005

(65) Prior Publication Data

US 2005/0200506 A1 Sep. 15, 2005

(30) Foreign Application Priority Data

Feb. 27, 2004 (DE) ...................... 10 2004 009 613

(51) Int. Cl.
*H03M 1/06* (2006.01)
(52) U.S. Cl. .................. 341/118; 341/138; 341/141; 341/155; 341/159
(58) Field of Classification Search ............... 341/118, 341/138, 141, 159
See application file for complete search history.

(56) References Cited

U.S. PATENT DOCUMENTS

| | | | |
|---|---|---|---|
| 4,345,241 A * | 8/1982 | Takeuchi et al. ............ | 341/118 |
| 4,633,226 A | 12/1986 | Black, Jr. | |
| 4,763,105 A * | 8/1988 | Jenq ............................ | 341/120 |
| 4,968,988 A | 11/1990 | Miki et al. | |
| 5,221,926 A | 6/1993 | Jackson | |
| 5,294,926 A * | 3/1994 | Corcoran ..................... | 341/120 |
| 5,537,113 A * | 7/1996 | Kawabata .................... | 341/141 |
| 5,563,596 A * | 10/1996 | Snyder et al. ............... | 341/131 |
| 5,585,796 A * | 12/1996 | Svensson et al. ........... | 341/155 |
| 5,973,633 A | 10/1999 | Hester | |
| 6,452,518 B1 * | 9/2002 | Kawabata .................... | 341/118 |
| 6,522,282 B1 * | 2/2003 | Elbornsson ................. | 341/155 |

\* cited by examiner

*Primary Examiner*—Rexford Barnie
*Assistant Examiner*—Khai Nguyen
(74) *Attorney, Agent, or Firm*—Maginot, Moore & Beck

(57) ABSTRACT

A circuit arrangement (10) for compensating for nonlinearities (NL1, NL2) from analog/digital converters (15, 16) operating with different timing, having at least two analog/digital converters (15, 16) which are each clocked with different timing and which each have a predetermined nonlinear converter characteristic with integral nonlinearities (NL1, NL2), and which accept an analog input signal (VIN) applied to an input (11) on the circuit arrangement and respectively convert it into a digital intermediate signal (Z1, Z2); and having a multiplexer (22) which is arranged downstream of the analog/digital converters and which successively switches through the digital intermediate signals (Z1, Z2) in order to produce a digital output signal (ZD) from the circuit arrangement (10); where at least one of the nonlinear converter characteristics of the various analog/digital converters (15, 16) is predetermined such that after the intermediate signals have been combined in the multiplexer (22) the integral nonlinearities (NL1, NL2) in the various analog/digital converters (15, 16) essentially compensate for one another.

20 Claims, 5 Drawing Sheets

FIG 6

CIRCUIT ARRANGEMENT FOR COMPENSATION FOR NONLINEARITIES FROM ANALOG/DIGITAL CONVERTERS OPERATING WITH DIFFERENT TIMING

FIELD OF THE INVENTION

The present invention relates to a circuit arrangement for compensating for nonlinearities from analog/digital converters operating with different timing, particularly in the case of converters whose nonlinearity-determining components are known.

BACKGROUND

Arrays of analog/digital converters operating in parallel comprise a plurality of analog/digital converters which digitize an analog signal in parallel but with a certain timing offset. The individual digital signals are then recombined using a multiplexer, so that effectively a higher sampling rate than that of the individual analog/digital converters is achieved. Such converter arrays are also called TIADCs (Time Interleaved Analog to Digital Converters).

In the simplest case of a TIADC, two analog/digital converters are connected in parallel, alternately sample a common analog input signal and digitize it. As a result, the sampling or conversion rate of the overall system appears to be twice that of the sampling rate of the individual analog/digital converters.

In the more general case, increasing the number of analog/digital converters operating in parallel or increasing the number of channels, in the case of N analog/digital converters, allows the effective sampling rate of the converter array to be increased to N times the sampling rate of a single analog/digital converter.

Figure 1:
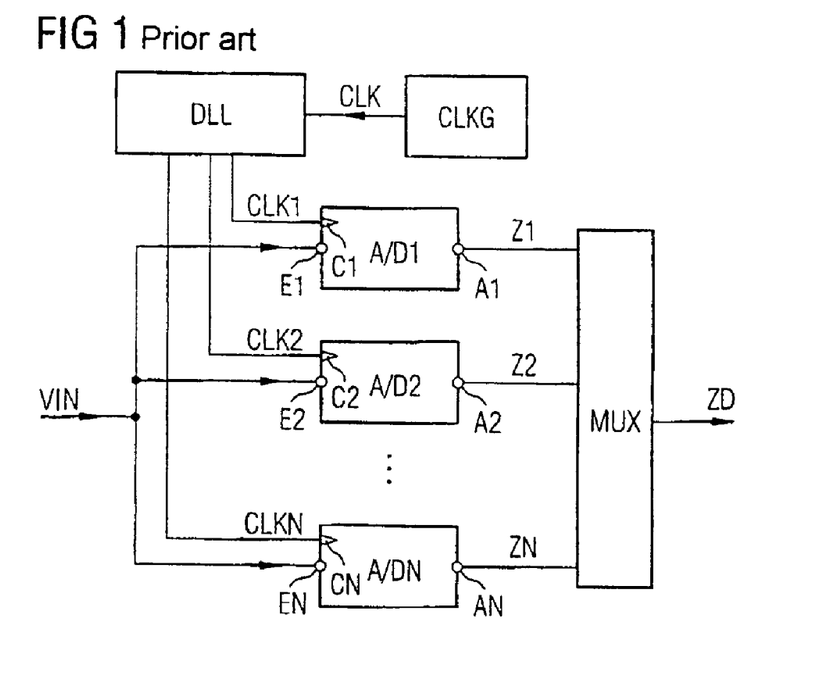
FIG. 1 shows an analog/digital converter array based on the prior art.

FIG. 1 shows a converter array or TIADC based on the prior art. There are N analog/digital converters A/D1, A/D2, ..., A/DN, which each have an analog input E1, E2, ..., EN, a digital output A1, A2, ..., AN and an input C1, C2, ..., CN for a respective clock signal CLK1, CLK2, ..., CLKN.

The analog inputs E1, E2, ..., EN have a common analog input signal VIN applied to them. The outputs A1, A2, ..., AN of the analog/digital converters A/D1, A/D2, ..., A/DN deliver respective digital intermediate signals Z1, Z2, ..., ZN which are switched through in succession by a downstream multiplexer MUX as digital output signal ZD from the TIADC.

A clock generator CLKG produces a global clock signal CLK, which is routed to a delay locked loop DLL and is used to produce an N phase clock, or N clock signals CLK1, CLK2, ..., CLKN which each have the same clock period T as the global clock signal CLK, but in each case with a delay by a timing offset of $T/N=\Delta T$. These clock signals CLK1, CLK2, ..., CLKN are each routed to the clock inputs C1, C2, ..., CN of the individual analog/digital converters A/D1, A/D2, ..., A/DN.

In the case of such arrays, there is the difficulty that any type of inequality among the individual converters results in conversion errors. By way of example, different offset values in the various analog/digital converters result in interfering sounds at frequencies which comprise whole portions of the sampling frequency. Different nonlinearities in the channels, differences in the gain, discrepancies from the ideal sampling time or a different bandwidth in the analog/digital converters also result in unwanted interference in the digital output signal.

In particular, different nonlinearity properties in the analog/digital converters used result in output signal energies in the converter array's frequency spectrum which interfere.

Figure 2:
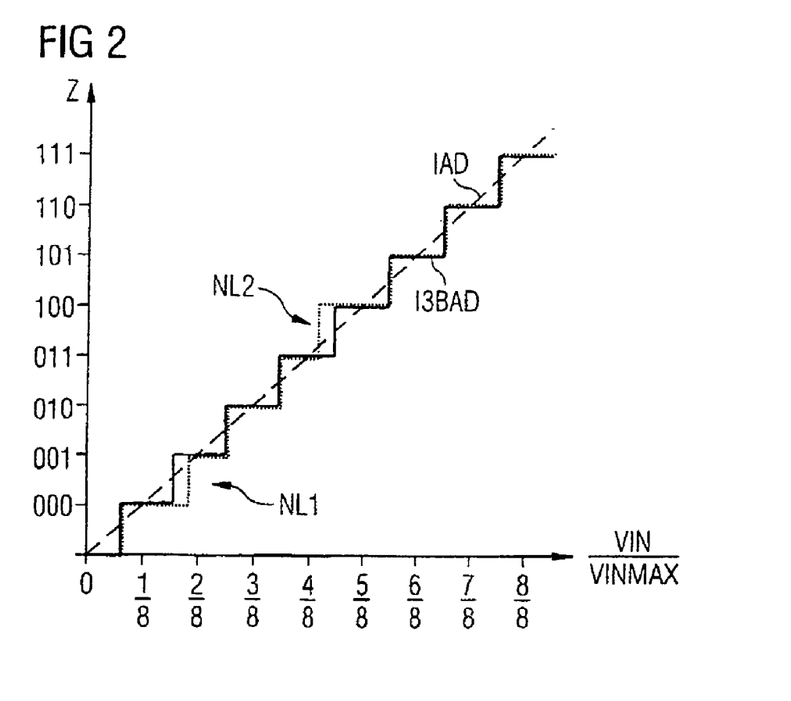
FIG. 2 shows characteristics for 3-bit analog/digital converters.

FIG. 2 shows the characteristic for a 3-bit analog/digital converter by way of example. In the case of a characteristic or transfer function for an analog/digital converter, the digital output signal Z is plotted over the analog input signal VIN, which in this case has been normalized to the maximum level of the analog input signal VINMAX. An ideal converter with infinitely high resolution would result in an exact bisector IAD as characteristic. An ideal characteristic for an ideal analog/digital converter with finite resolution provides a staircase curve I3BAD, the steps all having the same width and height. The dotted line corresponds to a characteristic for a 3-bit analog/digital converter which has two nonlinearities NL1, NL2. The integral nonlinearity or the linearity error is a measure of the maximum discrepancy in the converter characteristic from the bisector and is normally indicated in the number of the least significant bit. The nonlinearity NL1 is a positive linearity error, for example, and the nonlinearity NL2 is a negative nonlinearity error.

Figure 3A:
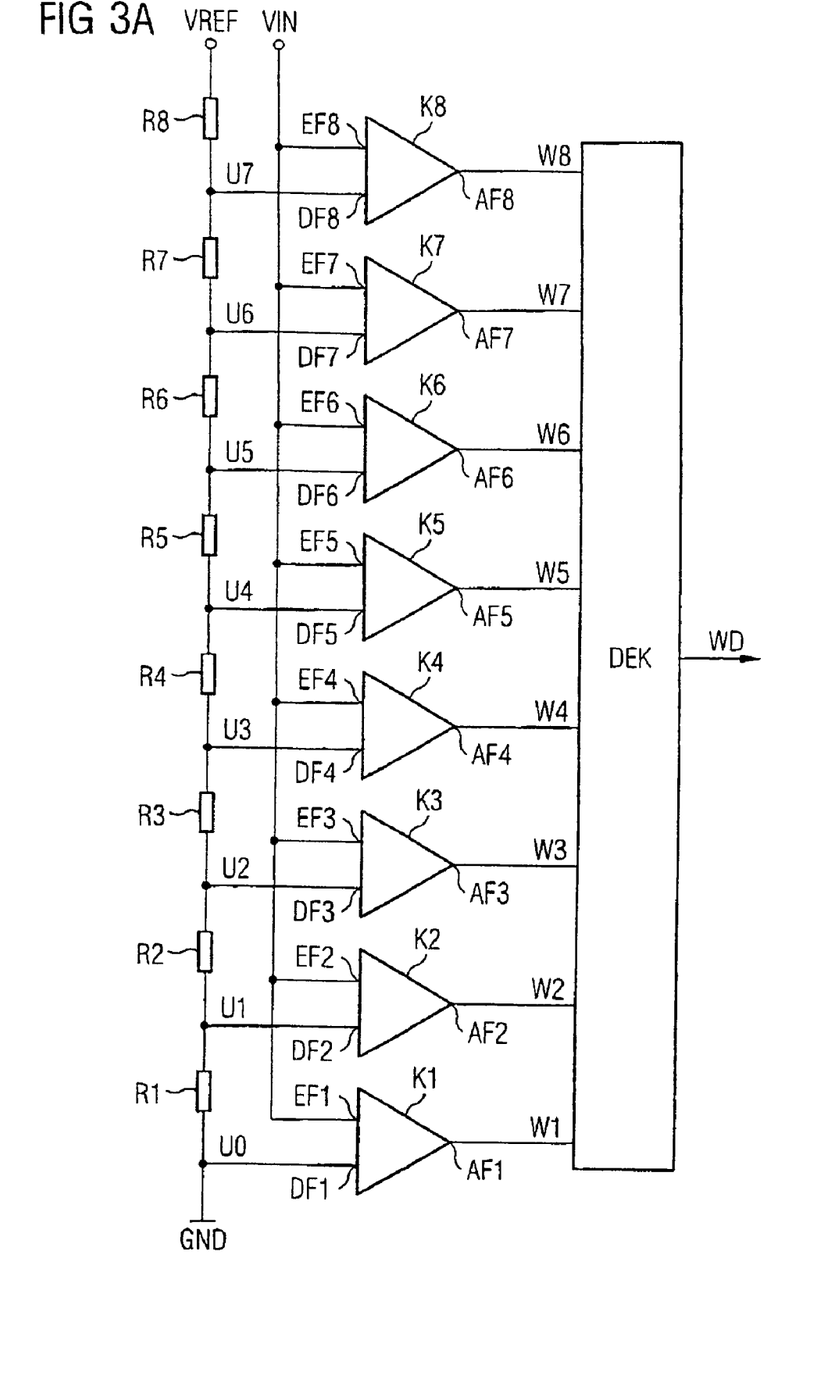
FIG. 3A shows a basic circuit diagram of a flash converter based on the prior art.

Methods are known for reducing but not eliminating nonlinearities in analog/digital converters. FIG. 3A shows a basic circuit diagram of a flash analog/digital converter by way of example.

The converter has a plurality of comparators K1–K8 which each have a first input EF1–EF8, a second input DF1–DF8 and an output AF1–AF8. The first inputs EF1–EF8 have received an analog input signal VIN.

A resistor ladder is provided which comprises a plurality of resistors R1–R8 which are connected between a first reference voltage VREF and a second reference voltage or ground GND. Between the resistors, it is possible to tap off reference potentials U0–U7 which are each routed to the second inputs DF1–DF8 of the comparators K1–K8.

The comparators K1–K8 deliver intermediate signals W1–W8 which are routed to a decoder DEK. Since the comparators K1–K8 have different switching potentials or switching thresholds as a result of the reference voltage U0–U7, the intermediate signals W1–W8 map the analog input signal into a digital signal in the thermometer code. This thermometer code is converted into a suitable digital code by the decoder DEK and is output as a digital output signal WD.

A corresponding analog/digital converter such as is shown in FIG. 3A normally has nonlinearities as a result of comparators K1–K8 which are not of exactly identical design. This may be caused inter alia, by fluctuations in the substrate properties of a semiconductor substrate on which the converter is produced. As a result, the switching thresholds of the comparators may not be exactly equidistant, for example, and hence may cause one or more nonlinearities in the transfer characteristic of the converter.

Figure 3B:
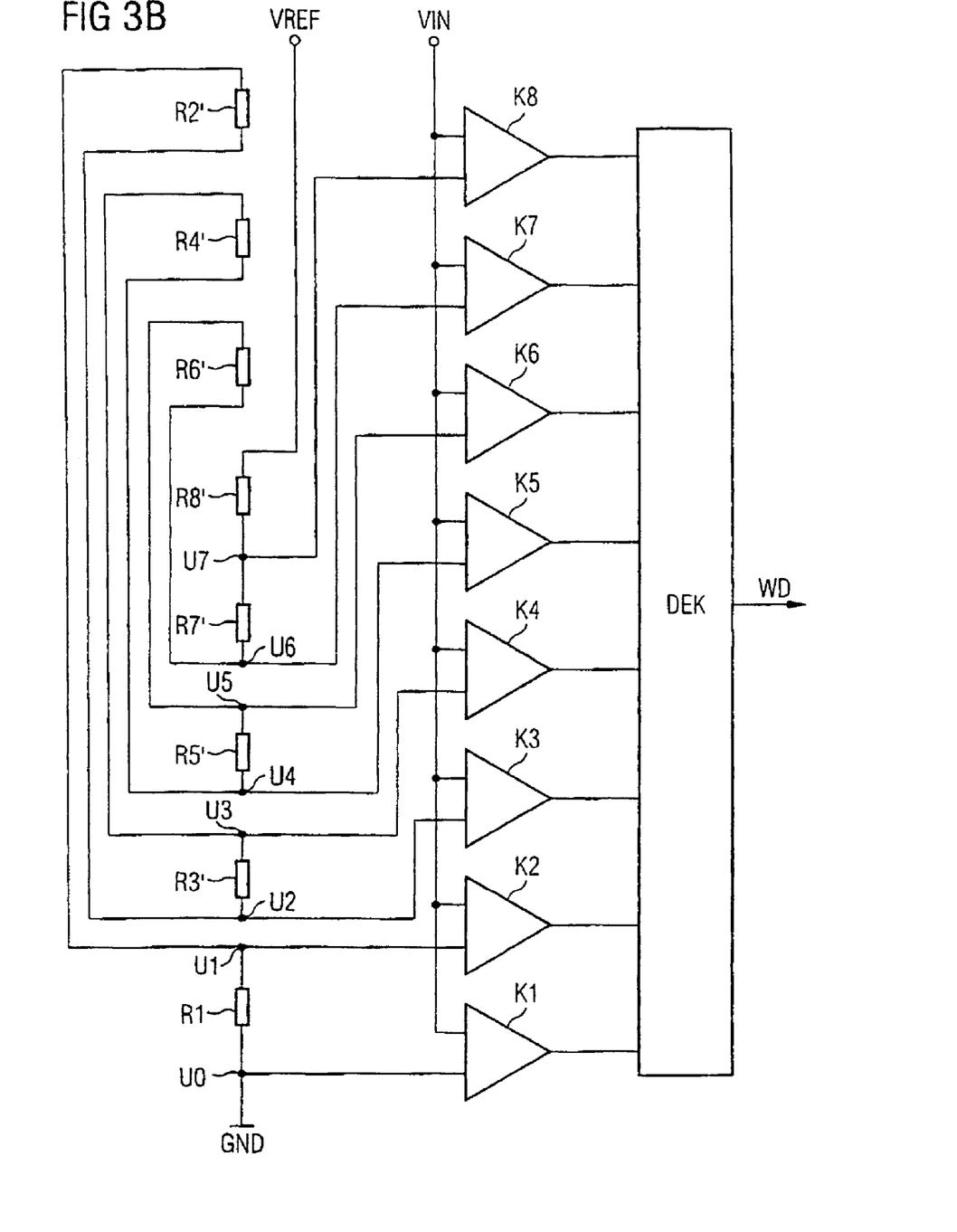
FIG. 3B shows a flash converter with topologically interchanged resistors.

FIG. 3B describes a possible compensation for nonlinearities by virtue of topological interchange of the resistors in the resistor ladders.

Accordingly, the resistors in the resistor ladders are connected up such that the voltage dropping across the original resistor R1 or the corresponding reference potential U1 is routed to the comparator K2.

The voltage U2 dropping across the original resistor R8 (in this case referred to as R2') is connected to the third comparator K3.

The voltage U3 dropping across the original resistor R2 (in this case referred to as R3') is connected to the fourth comparator K4.

The voltage U5 dropping across the original resistor R7 (in this case referred to as R4') is connected to the comparator K5.

The voltage U6 dropping across the original resistor R6 (in this case referred to as R6') is connected to the comparator K7.

Finally, the voltage U7 dropping across the original resistor R4 (in this case referred to as R7') is connected to the comparator K8.

Hence, the resistor R1 from FIG. 3B corresponds to the resistor R1 from FIG. 3A, the resistor R3' corresponds to the resistor R2, the resistor R4' corresponds to the resistor R7, the resistor R5' corresponds to the resistor R3, the resistor R6' corresponds to the resistor R6, the resistor R7' corresponds to the resistor R4, and the resistor R8' corresponds to the resistor R5.

Such topological interchange based on the prior art in order to compensate for or reduce nonlinearities is very complex in terms of connections, however. This additional connection also causes parasitic capacitance which severely restricts the maximum clock frequency of the flash converter. Furthermore, such additional connection needs to be reserved for each analog/digital converter contained in a converter array as described in FIG. 1. The method of topological interchange is therefore disadvantageous for analog/digital converters which are provided for use in TIADCs or converter arrays.

It is therefore an object of the present invention to provide a circuit arrangement for compensating for nonlinearities from analog/digital converters operating with different timing which has low circuit complexity and can be implemented independently of production technology.

SUMMARY

This object is achieved by means of a circuit arrangement having the features of embodiments of the invention.

Accordingly, a circuit arrangement for compensating for nonlinearities from analog/digital converters operating with different timing is provided which has at least two analog/digital converters which are each clocked with different timing and which each have a predetermined nonlinear converter characteristic with integral nonlinearities, and which accept an analog input signal applied to an input on the circuit arrangement and respectively convert it into a digital intermediate signal. The inventive circuit arrangement also has a multiplexer which is arranged downstream of the analog/digital converters and which successively switches through the digital intermediate signals in order to produce a digital output signal from the circuit arrangement. In this case, at least one of the nonlinear converter characteristics of the various analog/digital converters is predetermined such that after the intermediate signals have been combined in the multiplexer the integral nonlinearities in the various analog/digital converters essentially compensate for one another.

The idea underlying the present invention is that the interaction of the individual nonlinear characteristics of the respective analog/digital converters is utilized. Since the individual analog/digital converters used are not altered in order to eliminate their nonlinearities, but rather the existing integral nonlinearities are used such that they compensate for one another on average, that is to say after all of the intermediate signals have been combined to form the digital output signal, the inventive circuit arrangement is particularly simple. Conventionally, the analog/digital converters arranged in the array are in as identical a form as possible. In line with the invention, however, a complementary form is provided in terms of the linearity errors.

In line with one preferred embodiment, the nonlinear converter characteristics of the analog/digital converters are predetermined such that each integral nonlinearity in a first analog/digital converter has a respective complementary integral nonlinearity in the second analog/digital converter predetermined for it. This has the advantage that integral nonlinearities are respectively determined in pairs and practically compensate for one another.

It is particularly preferred for the nonlinear converter characteristics of the analog/digital converters to be predetermined such that an output signal energy caused by the nonlinearities is distributed over higher frequency ranges of a frequency spectrum in the circuit arrangement. The distribution over high frequency ranges distributes the incorrect output signal energies caused by the nonlinearities over frequency ranges which are not fundamental to the frequency response of the circuit arrangement. With particular preference, these higher frequency ranges are above the Nyquist frequency of the analog/digital converters.

In one particularly preferred embodiment of the inventive circuit arrangement, the various analog/digital converters are each arranged on the same semiconductor substrate and each have nonlinearity-determining semiconductor components. These nonlinearity-determining semiconductor components are arranged on the semiconductor substrate such that they are arranged in a direction which is prescribed by a technology-dependent gradient. Preferably, this gradient is a layer thickness fluctuation or a doping fluctuation.

This has the advantage that the nonlinearity properties of the various analog/digital converters are dependent on the technology-dependent gradient and hence the analog/digital converters are advantageously arranged on the semiconductor substrate such that the respective nonlinearity-determining semiconductor components produce respective nonlinear converter characteristics, so that in the case of at least two analog/digital converters their converter characteristics differ from an ideal converter characteristic in complementary fashion.

In one preferred development of the inventive circuit arrangement, a plurality of analog/digital converters are in the form of flash converters. These each have a plurality of comparators having a first input, a second input and an output, respectively. The flash converters each have a decoder to which the outputs of the comparators are connected and which outputs a respective one of the digital intermediate signals. In this case, the first inputs of the comparators are coupled to the input of the circuit arrangement, and the second inputs of the comparators are each coupled to reference voltages. The reference voltages can each be tapped off between resistors in a respective resistor ladder. In this arrangement, the non-linearity-determining components are the comparators, and the individual flash converters are each arranged on the semiconductor substrate around a mirror axis which runs at right angles to the gradient.

The preferred development of the inventive circuit arrangement advantageously makes use of the fact that when, by way of example, two flash analog/digital converters are in a mirror-image arrangement their nonlinearities are also respectively complementary to one another. As a result, the integral nonlinearities of the various flash converters compensate for one another in line with the invention.

Further advantageous refinements and developments of the invention are covered by the subclaims and by the description with reference to the figures.

DETAILED DESCRIPTION

Figure 4:
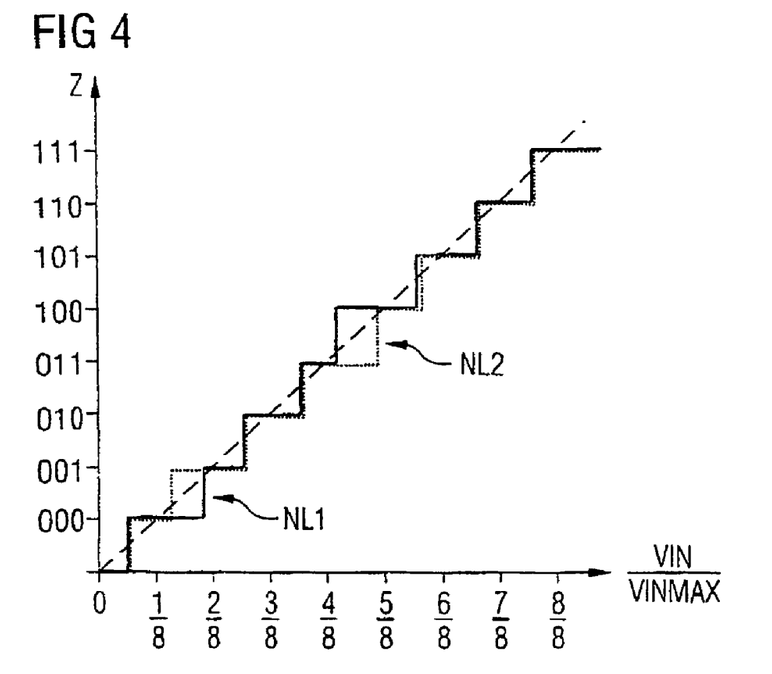
FIG. 4 shows two complementary characteristics for analog/digital converters.

FIG. 4 shows two converter characteristics using the example of 3-bit analog/digital converters which each have complementary, integral nonlinearities NL1, NL2. The first characteristic is shown in dots, and the second characteristic is solid. A central characteristic, which has been obtained by adding the two characteristics and dividing by two, maps an ideal staircase curve as a characteristic.

This means that when two analog/digital converters, one of which has the dotted characteristic and the second of which has the solid characteristic, are arranged in an array and alternately sample and convert a common analog input signal, the output characteristic of the converter array has no further nonlinearities on average. If the characteristics are not exactly mirrored at the bisector, but rather have just complementary nonlinearities which have different arithmetic signs (positive and negative linearity error), then there is at least an improvement in the linearity of a converter array based on the invention.

On the basis of the prior art, analog/digital converters provided for use in an array are produced as identically as possible, i.e. they also have the same nonlinearities. In line with the invention, however, precisely one existing nonlinearity is utilized by likewise providing the array with a complementary analog/digital converter in terms of the linearity errors. Since the analog/digital converters normally have nonlinearity-determining components, such as comparators or resistors, and the respective analog/digital converter is produced On a semiconductor substrate, it is possible to provide complementary analog/digital converters or analog/digital converters having complementary nonlinearities by virtue of their arrangement on the semiconductor substrate.

Figure 5:
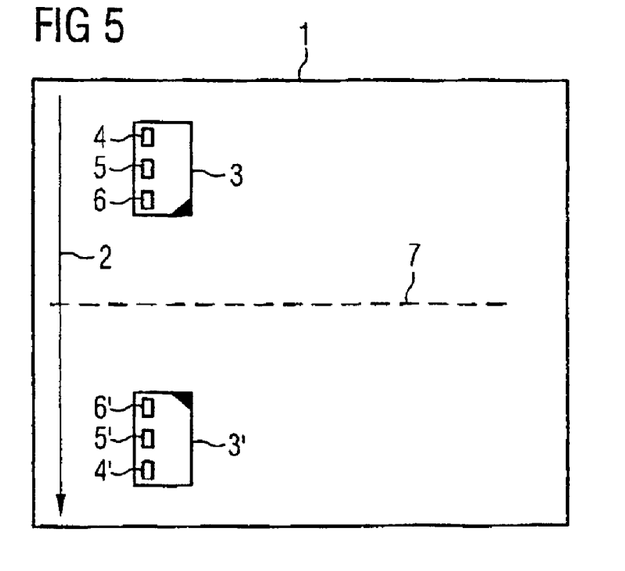
FIG. 5 shows an inventive arrangement of analog/digital converters on a semiconductor substrate.

FIG. 5 shows an inventive arrangement of analog/digital converters on a semiconductor substrate.

A semiconductor substrate 1 holding the analog/digital converters or the entire array normally have fluctuations in layer thicknesses and/or dopings which follow a gradient 2. These gradients are conditioned by technological inaccuracies.

The semiconductor substrate 1 holds two analog/digital converters 3, 3' which each have nonlinearity-determining components 4, 5, 6, 4', 5', 6'. The two analog/digital converters are arranged such that they are situated opposite a mirror axis 7 which runs at right angles to the gradient 2. By way of example, the nonlinearity-determining components may be comparators in a flash converter. If the gradient 2 has a linear profile, then the nonlinearity-determining components 4, 5, 6, 4', 5', 6' in the two analog/digital converters 3, 3' each have precisely the complementary effect on the nonlinearity of the respective converter 3, 3'. Similarly, further analog/digital converters can be produced in complementary pairs.

Figure 6:
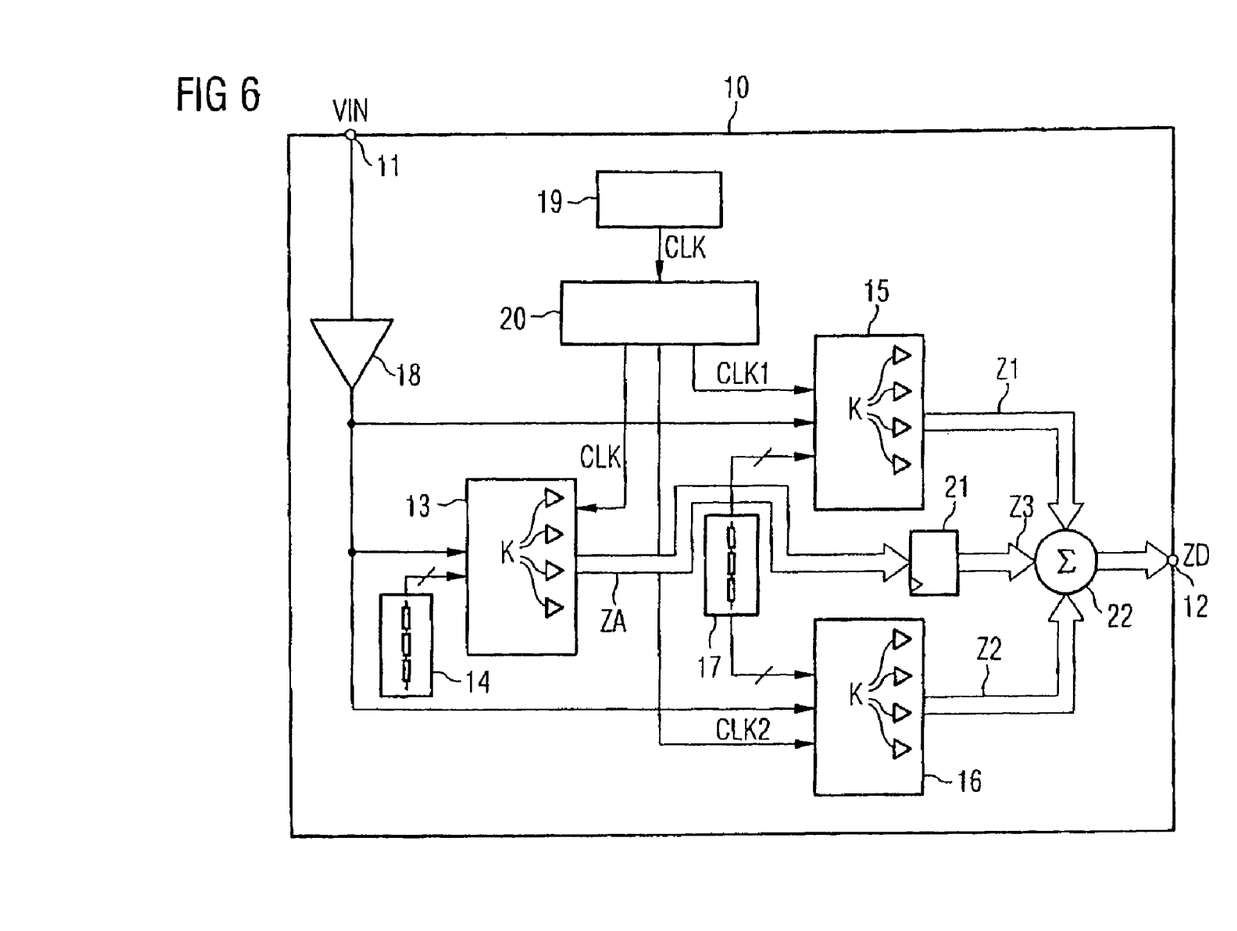
FIG. 6 shows a multistage analog/digital converter based on the invention.

FIG. 6 shows a block diagram of a multistage analog/digital converter with complementary converters based on the invention.

The two-stage analog/digital converter 10 has an input 11 for inputting an analog input signal VIN and a digital output 12 for outputting a digital output signal ZD.

A first coarse analog/digital converter 13 is provided which is in the form of a flash converter and has appropriate comparators K. The coarse analog/digital converter 13 is coupled to a resistor chain 14 which provides reference voltages for the comparators K.

In addition, the multistage analog/digital converter 10 has a first fine analog/digital converter 15 and a second fine analog/digital converter 16. The two fine analog/digital converters 15, 16 are likewise in the form of flash analog/digital converters and accordingly have comparators K. In this exemplary embodiment, the comparators are the nonlinearity-determining components.

A second resistor chain 17 is provided which is coupled to the two fine analog/digital converters 15, 16 and provides the corresponding comparators K with reference potentials.

The analog input signal VIN is amplified in an input driver 18 and is supplied as analog input signal Z1 to the coarse analog/digital converter 13, to the first fine analog/digital converter 15 and to the second fine analog digital converter 16.

A clock generator 19 is provided which delivers a clock signal CLK which is routed to a clock control unit 20. The clock control unit 20 supplies the coarse analog/digital converter 13 with the clock signal CLK, supplies the first fine analog/digital converter 15 with a clock signal CLK1, and supplies the second fine analog/digital converter 16 with a clock signal CLK2. In this case, the second clock signal CLK2 has half the clock frequency of the clock signal CLK, and the first clock signal CLK1 is the complement or inverse of the second clock signal CLK2.

The digital output signal ZA from the coarse analog/digital converter 13 is routed to a buffer store 21, is buffer-stored therein and is supplied as buffer-stored signal Z3 to an adder 22. In addition, the adder 22 is supplied with the first intermediate signal Z1 from the first fine analog/digital converter 15 and with the second intermediate signal Z2 from the second fine analog/digital converter 16. The adder 22 adds the three signals ZA, Z1, Z3 to produce the digital output signal Zd, which is routed to the output 12.

The nonlinearity-determining components in the two fine analog/digital converters 15, 16 are each comparators K. In line with the invention, the fine analog/digital converters 15, 16 are arranged as shown in FIG. 5, for example, in order to provide complementary characteristics for the two analog/digital converters 15, 16.

The coarse analog/digital converter 13 first delivers a coarse digital converter result ZA, which is buffer-stored in the memory 21. The two fine stages or fine analog/digital converters 15, 16 are each clocked at half the clock frequency, but in complementary fashion. They therefore alternately deliver a fine conversion result or the first and second digital intermediate signals Z1, Z2. In line with the invention, the two finely operating analog/digital converters 15, 16 compensate for each other's nonlinearities, which means that the characteristic of the two-stage converter 10 is extremely linear overall.

In conventional multistage converters, the fine analog/digital converters are made as identical as possible, which means that the nonlinearities in the digital output signal are also noticeable in the result from the corresponding entire multistage converter.

Although the present invention has been described above with reference to preferred embodiments, it is not limited thereto, but rather can be modified in a wide variety of ways.

Hence, the invention is particularly not limited to the design described in FIG. 6 for a two-stage converter, but rather can be extended to a multiplicity of stages and particularly to the parallel arrangement of a large number of analog/digital converters which have nonlinearities based on the invention.

In particular, the physical arrangement of analog/digital converters on semiconductor substrates does not necessarily have to be as described in FIG. 5. The nonlinearity-determining components may also have a nonparallel arrangement in respect of the gradient, provided that there is mirroring at a mirror axis which is at right angles to the gradient 2.

Even when there are nonlinear gradients, the inventive idea of complementary integral nonlinearities can be applied, with at least the nonlinearity of a converter array being significantly less than the nonlinearities of the individual analog/digital converters used.

The invention affords in particular the advantage that it can be used independently of technology. The invention requires no additional connection or modification of the basic elements of TIADCs or analog/digital converter arrays and may be used on many types of analog/digital converters, e.g. parallel converters, cascade converters, converters which use successive approximation for conversion, converters which operate using the counting method etc.

The inventive compensation for nonlinearities in arrays of analog/digital converters operating with different timing results in significantly improved conversion results.

The invention claimed is:

1. A circuit arrangement for compensating for nonlinearities from analog/digital converters operating with different timing, comprising:
    at least two analog/digital converters which are each clocked with different timing, each of the at least two analog/digital converters having a predetermined nonlinear converter characteristic with integral nonlinearities, each of the at least two analog/digital converters configured to receive an analog input signal and convert the analog input signal into a digital intermediate signal; and
    a circuit unit operably coupled to receive the digital intermediate signals from the at least two analog/digital converters, the circuit unit configured to successively provide the digital intermediate signals in order to produce a digital output signal;
    wherein a first nonlinear converter characteristic of a first analog/digital converter has a predetermined relationship with a first nonlinear converter characteristic of a second analog/digital converter such that after the digital intermediate signals have been successively provided by the circuit unit, at least some integral nonlinearities in the at least two analog/digital converters at least partially compensate for one another.

2. The circuit arrangement as claimed in claim 1, where each integral nonlinearity in the first analog/digital converter has a respective complementary integral nonlinearity in the second analog/digital converter.

3. The circuit arrangement as claimed in claim 1, wherein nonlinear converter characteristics of the first and second analog/digital converters are predetermined such that an output signal energy caused by the nonlinear converter characteristics is distributed over higher frequency ranges of a frequency spectrum in the circuit arrangement.

4. The circuit arrangement as claimed in claim 1, where the first and second analog/digital converters are each arranged on a semiconductor substrate, each analog/digital converter having nonlinearity-determining semiconductor components which are arranged on the semiconductor substrate in a direction which is prescribed by a technology-dependent gradient.

5. The circuit arrangement as claimed in claim 4, wherein the gradient comprises a layer thickness fluctuation.

6. The circuit arrangement as claimed in claim 4, wherein the gradient comprises a doping fluctuation.

7. The circuit arrangement as claimed in claim 4, wherein the nonlinearity-determining semiconductor components of the first and second analog/digital converters are arranged on the semiconductor substrate such that the respective nonlinear converter characteristics of the first and second analog/digital converters differ from an ideal converter characteristic in a complementary manner.

8. The circuit arrangement as claimed in claim 4, wherein each of the at least two analog/digital converters comprises a flash converter, each flash converter having a plurality of comparators having a first input coupled to receive the analog input signal, a second input coupled to receive a corresponding reference voltage, and an output, respectively, each of the at least two analog/digital converters having a decoder to which the outputs of the plurality of comparators are connected and which generates a respective one of the digital intermediate signals, and wherein the flash converters are arranged on the semiconductor substrate around a mirror axis which runs at right angles to the gradient.

9. A circuit arrangement, comprising:
    at least two analog/digital converters arranged on a semiconductor substrate, each analog/digital converter having a nonlinear converter characteristic having nonlinearities, and having nonlinearity-determining semiconductor components which are arranged on the semiconductor substrate in a direction which is prescribed by a technology-dependent gradient, the nonlinearity-determining semiconductor components being arranged on the semiconductor substrate such that at least two nonlinearities in the at least two analog/digital converters have a complementary effect on each other.

10. The circuit arrangement as claimed in claim 9, wherein the nonlinearity-determining semiconductor components include resistors.

11. The circuit arrangement as claimed in claim 9, wherein where the nonlinearity-determining semiconductor components include comparators.

12. The circuit arrangement as claimed in claim 9, wherein two analog/digital converters are arranged such that they are situated about a mirror axis which runs at right angles to the gradient.

13. The circuit arrangement as claimed in claim 9, wherein the gradient comprises a layer thickness fluctuation.

14. The circuit arrangement as claimed in claim 9, wherein the gradient comprises a doping fluctuation.

15. A two-stage analog/digital converter for converting an analog input signal into a digital output signal, comprising:
- a clocked, coarse analog/digital converter configured to generate a coarse digital conversion result from the analog input signal;
- a first and a second fine analog/digital converter configured to generate, respectively, a first and a second fine digital conversion result each of the fine analog/digital converters having a nonlinear converter characteristic;
- an adder configured to add the coarse conversion result and the two fine conversion results to produce the digital output signal;
- wherein the fine analog/digital converters are clocked at half the clock frequency of the coarse analog/digital converter and alternately provide fine conversion results; and
- wherein the nonlinear converter characteristics of the first and second fine analog/digital converters include mutually complementary nonlinearities.

16. The analog/digital converter as claimed in claim 15, wherein each of the fine analog/digital converters have at least one comparator that constitutes a nonlinearity-determining component.

17. The analog/digital converter as claimed in claim 16, wherein the two fine analog/digital converters shared a common resistor chain configured to provide reference potentials to the comparators in the two fine analog/digital converters.

18. The analog/digital converter as claimed in claim 15, further comprising a clock control unit configured to provide a coarse clock signal to the coarse analog/digital converter, to provide a first clock signal to the first fine analog/digital converter, and to provide a second clock signal to the second fine analog/digital converter, the first clock signal being interleaved with the second clock signal.

19. The analog/digital converter as claimed in claim 15, further comprising a buffer store configured to store temporarily the coarse conversion result, and to provide the coarse conversion result to the adder.

20. The analog/digital converter as claimed in claim 15, wherein the coarse analog/digital converter and the fine analog/digital converters comprise flash converters.

* * * * *